(12) United States Patent
Chang (10) Patent No.: US 11,310,932 B2
(45) Date of Patent: Apr. 19, 2022

(54) SERVER AND MOUNTING CAGE (71) Applicants: Inventec (Pudong) Technology Corporation, Shanghai (CN); INVENTEC CORPORATION, Taipei (TW)

(72) Inventor: Kuo En Chang, Taipei (TW)

(73) Assignees: INVENTEC (PUDONG) TECHNOLOGY CORPORATION, Shanghai (CN); INVENTEC CORPORATION, Taipei (TW)

(*) Notice: Subject to any disclaimer, the term of this patent is extended or adjusted under 35 U.S.C. 154(b) by 18 days.

(21) Appl. No.: 16/902,659

(22) Filed: Jun. 16, 2020

(65) Prior Publication Data

US 2021/0385962 A1 Dec. 9, 2021

(30) Foreign Application Priority Data

Jun. 5, 2020 (CN) .......................... 202010507175.7

(51) Int. Cl.
*H05K 7/14* (2006.01)
*H05K 5/02* (2006.01)
*H05K 7/16* (2006.01)

(52) U.S. Cl.
CPC ........... *H05K 7/1424* (2013.01); *H05K 5/023* (2013.01); *H05K 7/1487* (2013.01); *H05K 7/1489* (2013.01); *H05K 7/16* (2013.01)

(58) Field of Classification Search
None
See application file for complete search history.

(56) References Cited

U.S. PATENT DOCUMENTS

| | | | | |
|---|---|---|---|---|
| 5,481,431 A | * | 1/1996 | Siahpolo ................. | G06F 1/184 361/679.31 |
| 5,641,296 A | * | 6/1997 | Larabell .................. | G06F 1/184 439/157 |
| 9,122,458 B2 | * | 9/2015 | Yu ........................... | G06F 1/185 |
| 9,826,658 B1 | * | 11/2017 | Mao ...................... | H05K 7/1487 |
| 9,936,599 B1 | * | 4/2018 | Shih ....................... | G06F 1/183 |
| 10,251,300 B1 | * | 4/2019 | Mao ...................... | H05K 7/1489 |
| 10,470,334 B1 | * | 11/2019 | Mao ...................... | H05K 7/1487 |
| 10,863,644 B1 | * | 12/2020 | Tseng ................... | H05K 7/1487 |
| 2009/0273901 A1 | * | 11/2009 | Jaramillo ............. | H05K 7/1492 361/679.58 |

(Continued)

*Primary Examiner* — James Wu
*Assistant Examiner* — Christopher L Augustin
(74) *Attorney, Agent, or Firm* — Locke Lord LLP; Tim Tingkang Xia, Esq.

(57) ABSTRACT

A server including chassis, motherboard, mounting cage, first guide pillar and expansion card. Motherboard is stacked on chassis bottom plate. Mounting cage includes bearing base, handle and first pivot. Bearing base is located on a side of motherboard located away from the chassis bottom plate and located between two chassis side plates. One of two bearing base side plates includes first guide slot, and handle is pivotally connected to the one of two bearing base side plates via first pivot and includes engagement hole. First guide pillar is fixed to the one of two chassis side plates and slidably disposed in first guide slot of the one of two chassis side plates. First guide pillar is engaged into engagement hole of handle. Expansion card is stacked on bearing base bottom plate and electrically connected to motherboard.

1 Claim, 7 Drawing Sheets

(56) References Cited

U.S. PATENT DOCUMENTS

| | | | | |
|---|---|---|---|---|
| 2015/0103492 | A1* | 4/2015 | Wu | H05K 7/1431 361/726 |
| 2017/0347481 | A1* | 11/2017 | Kuan | G06F 1/181 |
| 2018/0329463 | A1* | 11/2018 | Liu | G06F 1/184 |

* cited by examiner

SERVER AND MOUNTING CAGE

CROSS-REFERENCE TO RELATED APPLICATIONS

This non-provisional application claims priority under 35 U.S.C. § 119(a) on Patent Application No(s). 202010507175.7 filed in China, on Jun. 5, 2020, the entire contents of which are hereby incorporated by reference.

BACKGROUND OF THE INVENTION

Technical Field of the Invention

The invention relates to a server and a mounting cage, more particularly to the server and the mounting cage including a handle.

Description of the Related Art

In general, in order to improve the performance of a server or to expand the function of the server, an expansion card is disposed in a server chassis and mounted on a motherboard. Also, the expansion card includes a plurality of connectors for the insertion of the memory cards. Due to the increasing demand for the buffering space provided by the memory cards, more and more connectors are included by the expansion card, such that the overall weight of the expansion card is increased. Accordingly, a handle is commonly disposed on the mounting cage where the expansion card is disposed to help the expansion card to be removed from or mounted on the motherboard.

However, existing handle is only supported by one supporting component fixed to a side plate of the mounting cage. Thus, during the operation of the handle, all the stress concentrates on that single supporting component. Also, it is laborious for a user to depart the expansion card from the motherboard, which reduces the convenience for the expansion card to be removed from or mounted on the motherboard.

SUMMARY OF THE INVENTION

The invention is to provide a server and a mounting cage to improve the convenience for the expansion card to be removed from or mounted on the motherboard with the help of the handle and to share the stress by the first guide pillar and the second guide pillar during the operation of the handle.

One embodiment of this invention provides a server including a chassis, a motherboard, a mounting cage, a first guide pillar and an expansion card. The chassis includes a chassis bottom plate and two chassis side plates. The two chassis side plates stand on the chassis bottom plate and are spaced apart from each other. The motherboard is stacked on the chassis bottom plate. The mounting cage includes a bearing base, a handle and a first pivot. The bearing base is located on a side of the motherboard that is located away from the chassis bottom plate and is located between the two chassis side plates. The bearing base includes a bearing base bottom plate and two bearing base side plates. The two bearing base side plates stand on the bearing base bottom plate and are spaced apart from each other. One of the two bearing base side plates includes a first guide slot, and the handle is pivotally connected to the one of the two bearing base side plates via the first pivot and includes an engagement hole. The first guide pillar is fixed to the one of the two chassis side plates and slidably disposed in the first guide slot of the one of the two chassis side plates. The first guide pillar is engaged into the engagement hole of the handle. The expansion card is stacked on the bearing base bottom plate and electrically connected to the motherboard.

Another embodiment of this invention provides a mounting cage configured to be fixed to a chassis side plate via a first guide pillar and including a bearing base, a second guide pillar, a handle, a slider and a linkage. The bearing base includes a bearing base bottom plate and two bearing base side plates. The two bearing base side plates stand on the bearing base bottom plate and are spaced apart from each other. One of the two bearing base side plates includes a first guide slot and a second guide slot that are spaced apart from each other. The first guide pillar is configured to be slidably disposed in the first guide slot. The second guide pillar is slidably disposed in the second guide slot. The handle is pivotally connected to the one of the two bearing base side plates and includes an engagement hole. The first guide pillar is configured to be engaged in the engagement hole. The slider is fixed to the second guide pillar. Two opposite ends of the linkage are respectively pivotally connected to the handle and the slider.

According to the server and the mounting cage disclosed by the above embodiments, the handle is pivotally connected to one of the bearing base side plate via the first pivot and includes the engagement hole for the engagement of the first guide pillar, and the first guide pillar is fixed to one of the chassis side plate and slidably disposed in the first guide slot of one of the bearing base side plate. Thus, the handle can help the expansion card to be removed from or mounted to the motherboard via the cooperation of the first guide pillar and the first guide slot, thereby improving the convenience for the expansion card to be removed from or mounted to the motherboard with the help of the handle.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
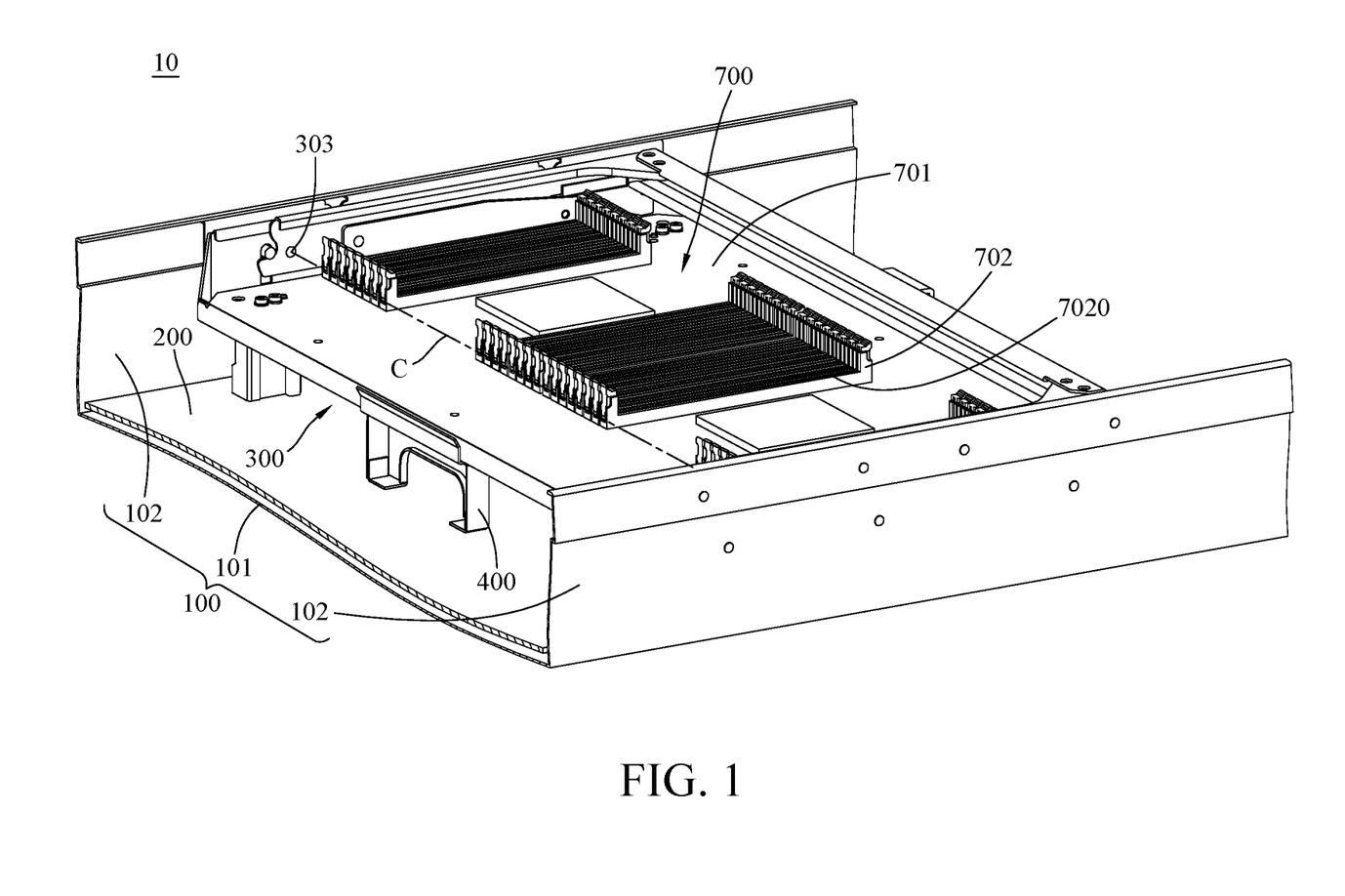
FIG. 1 is a partially enlarged perspective view of a server according to an embodiment of the invention.
Figure 2:
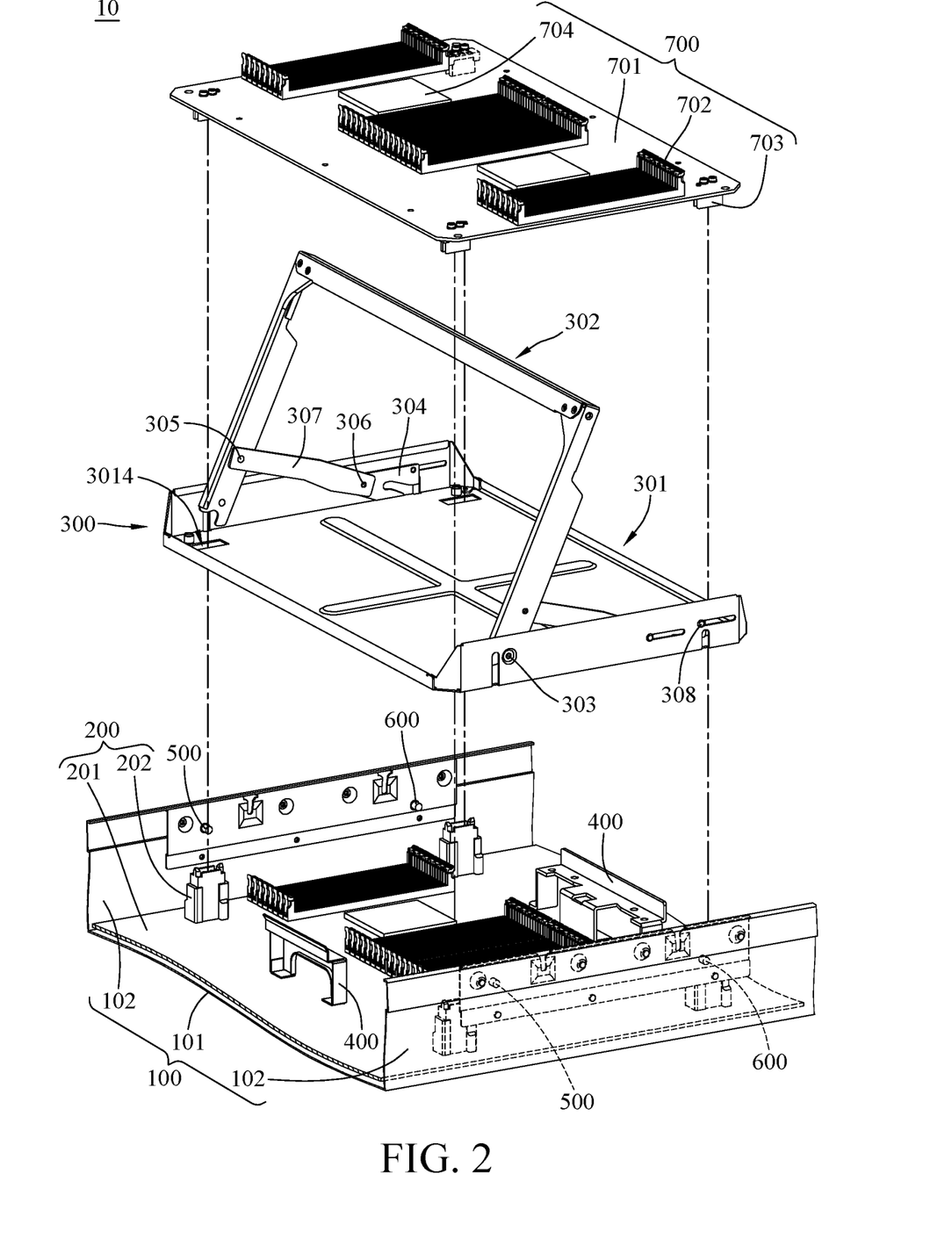
FIG. 2 is an exploded view of the server in FIG. 1.

Please refer to FIG. 1 and FIG. 2, where FIG. 1 is a partially enlarged perspective view of a server according to an embodiment of the invention, and FIG. 2 is an exploded view of the server in FIG. 1.

In this embodiment, the server 10 includes a chassis 100, a motherboard 200, a mounting cage 300, two support frames 400, two first guide pillars 500, two third guide pillars 600 and an expansion card 700.

The chassis 100 includes a chassis bottom plate 101 and two chassis side plates 102. The two chassis side plates 102 stand on the chassis bottom plate 101 and are spaced apart from each other.

In this embodiment, the motherboard 200 includes a main plate 201 and a plurality of first ports 202. The main plate 201 is stacked on the chassis bottom plate 101. The first ports 202 are disposed on a side of the main plate 201 that is located away from the chassis bottom plate 101.

Figure 3:
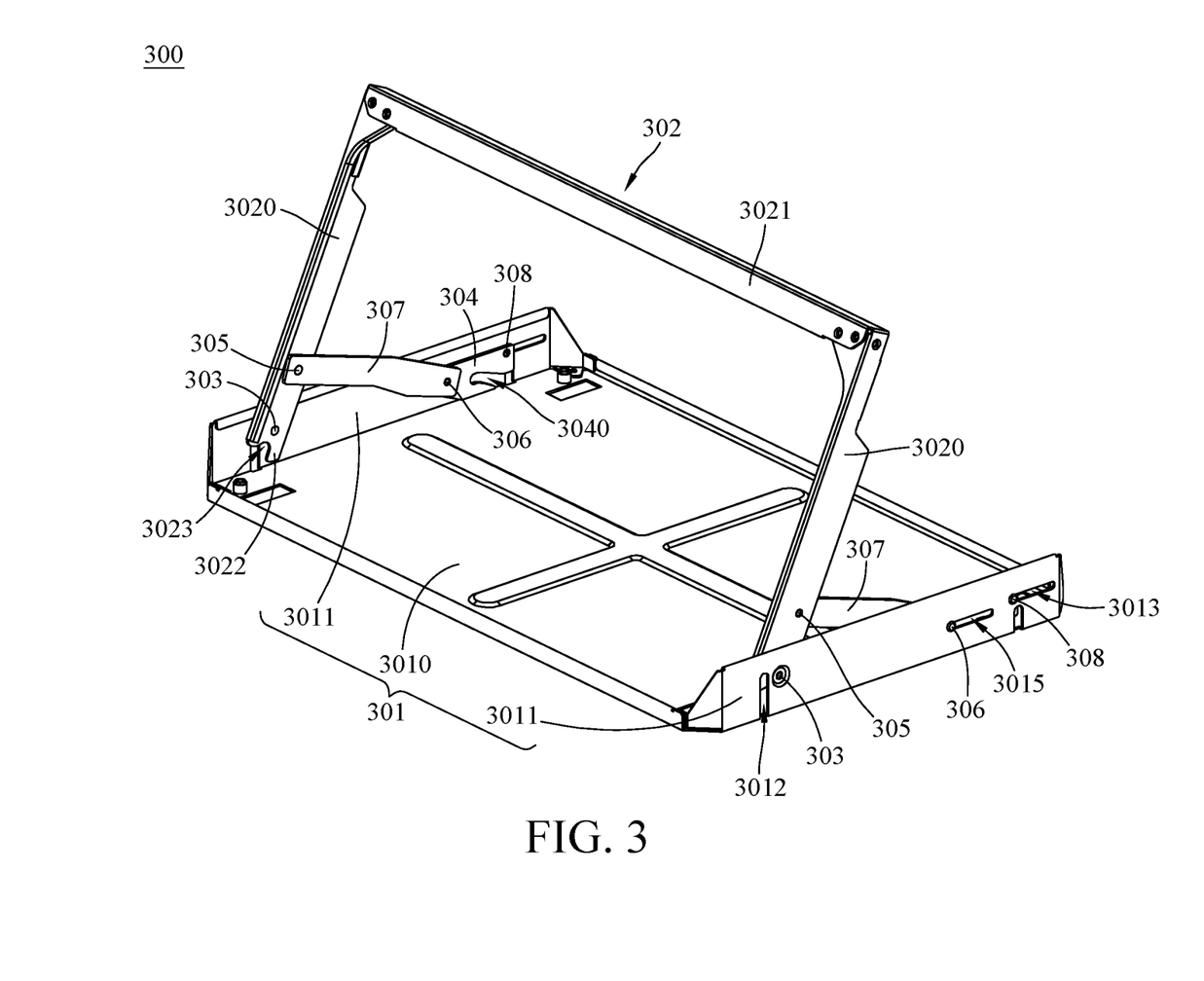
FIG. 3 is a perspective view of a mounting cage of the server in FIG. 1.
Figure 4:
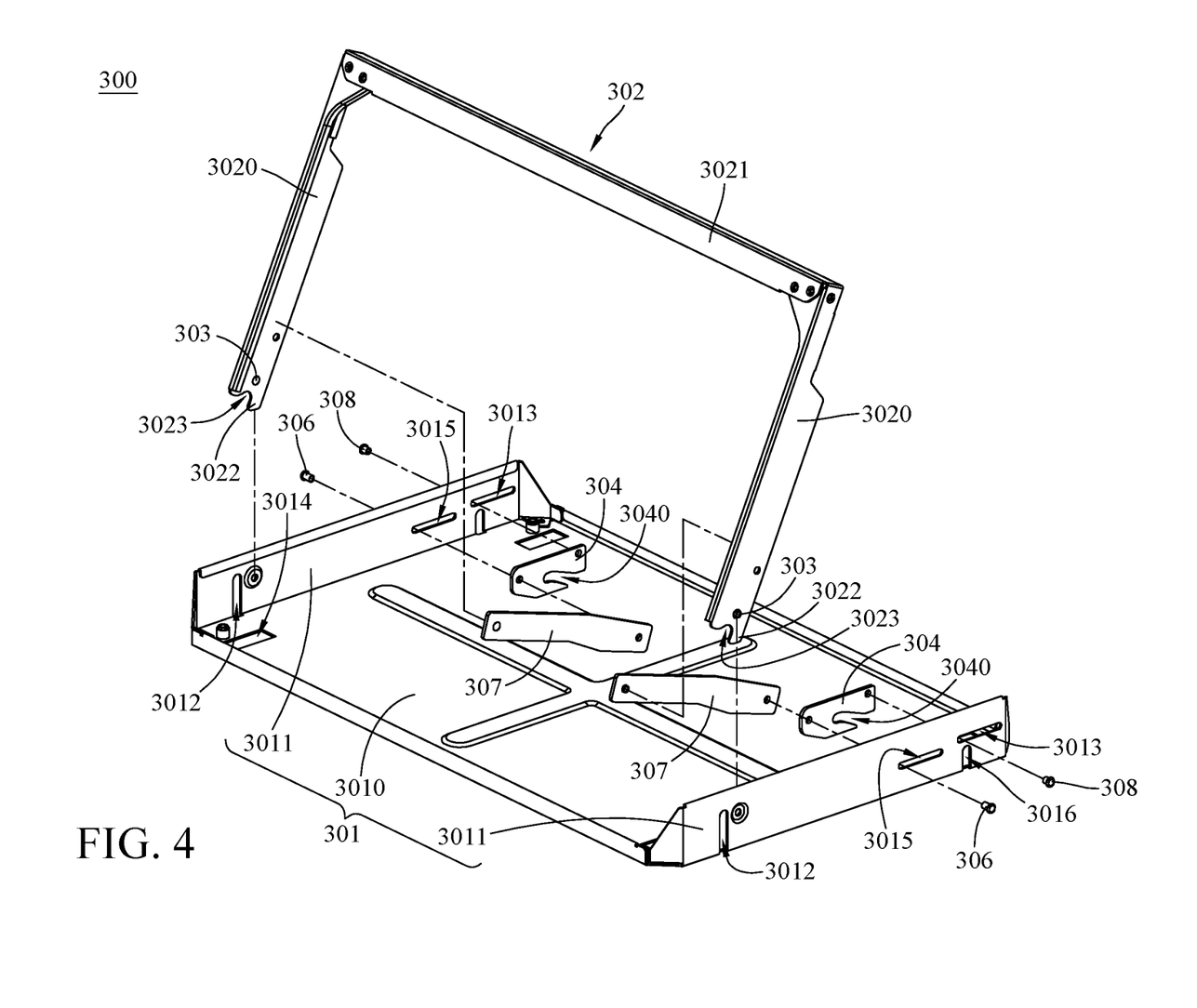
FIG. 4 is an exploded view of the mounting cage in FIG. 3.

Please refer to FIGS. 1 to 4, where FIG. 3 is a perspective view of a mounting cage of the server in FIG. 1, and FIG. 4 is an exploded view of the mounting cage in FIG. 3.

In this embodiment, the mounting cage 300 includes a bearing base 301, a handle 302, two first pivots 303, two sliders 304, two second pivots 305, two third pivots 306, two linkages 307 and two second guide pillars 308.

The bearing base 301 is located between the two chassis side plates 102. The bearing base 301 includes a bearing base bottom plate 3010 and two bearing base side plates 3011. The two bearing base side plates 3011 stand on the bearing base bottom plate 3010 and are spaced apart from each other. As shown in FIGS. 1 and 2, the bearing base bottom plate 3010 is supported by the support frames 400 so as to be located on a side of the motherboard 200 that is located away from the chassis bottom plate 101 and be spaced apart from the motherboard 200, where the support frames 400 are disposed on a side of the motherboard 200 that is located away from the chassis bottom plate 101. Also, each bearing base side plate 3011 includes a first guide slot 3012, a second guide slot 3013, a third guide slot 3015 and a fifth guide slot 3016 that are spaced apart from one another.

The two first guide pillars 500 are respectively fixed to the two chassis side plates 102 and are respectively slidably disposed in the two first guide slots 3012 of the two bearing base side plates 3011.

In this embodiment, the handle 302 includes two handheld parts 3020, a connecting part 3021 and two engagement parts 3022. The connecting part 3021 connects the two handheld parts 3020. Each engagement part 3022 protrudes from a side of each handheld part 3020 that is located away from the connecting part 3021. The two handheld parts 3020 are respectively pivotally connected to the two bearing base side plates 3011 via the two first pivots 303. In addition, each engagement part 3022 includes an engagement hole 3023. The two first guide pillars 500 are respectively engaged into the two engagement holes 3023 of the two engagement parts 3022.

The two sliders 304 are respectively fixed to the two second guide pillars 308, and the two second guide pillars 308 are respectively slidably disposed in the two second guide slots 3013. That is, the two sliders 304 are respectively slidably disposed in the two second guide slots 3013 via the two second guide pillars 308.

An end of each linkage 307 is pivotally connected to each handheld part 3020 of the handle 302 via each second pivot 305, where the second pivots 305 and the first pivots 303 are not coaxial. The other end of each linkage 307 is pivotally connected to each slider 304 via each third pivot 306, and the two third pivots 306 are respectively slidably disposed in the two third guide slots 3015 of the bearing base side plates 3011. In addition, in this embodiment, each second pivot 305 is located on a side of each first pivot 303 that is located away from each engagement hole 3023. That is, each second pivot 305 is located between each first pivot 303 and the connecting part 3021 of the handle 302, but the invention is not limited thereto. In other embodiments, each second pivot may be located on a side of each first pivot that is located close to each engagement hole, and that is, each first pivot is located between each second pivot and the connecting part of the handle.

Figure 5:
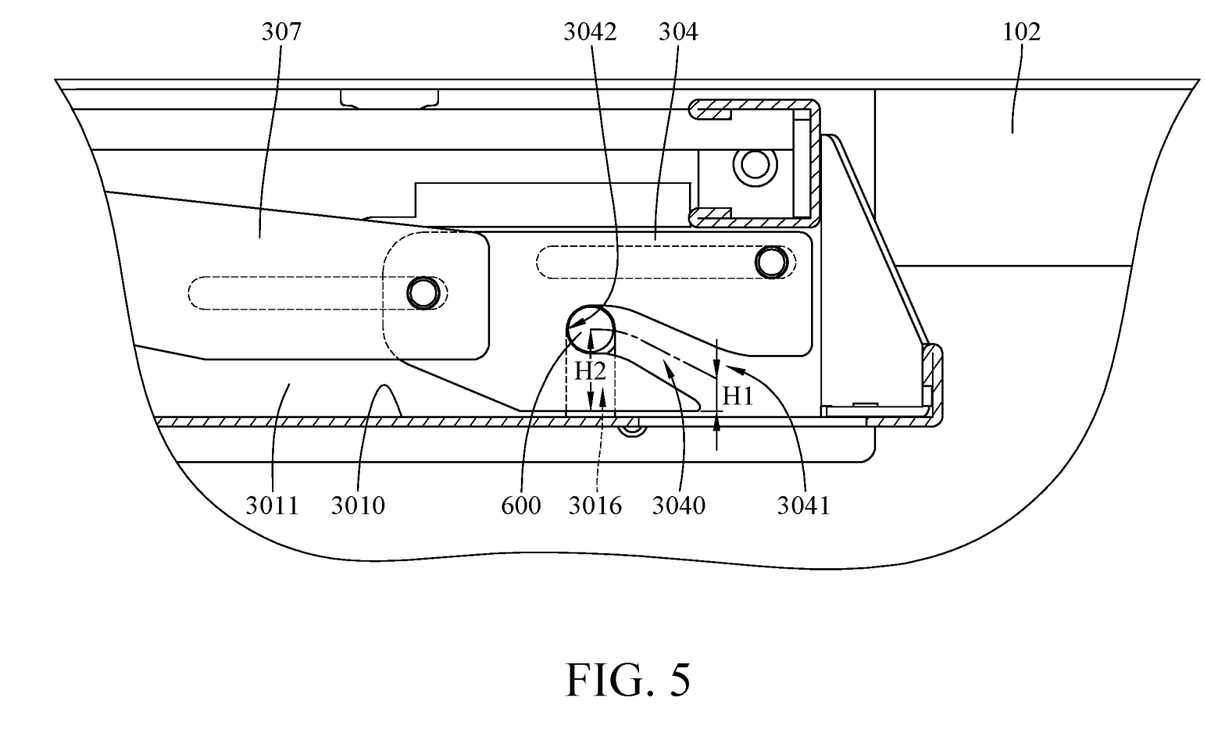
FIG. 5 is a partially enlarged side cross-sectional view of the server in FIG. 1.

Please refer to FIG. 4 and FIG. 5, where FIG. 5 is a partially enlarged side cross-sectional view of the server in FIG. 1. In this embodiment, each slider 304 includes a fourth guide slot 3040. The two third guide pillars 600 are respectively fixed to the two chassis side plates 102. Each third guide pillar 600 is slidably disposed in each fifth guide slot 3016 and each fourth guide slot 3040. In addition, as shown in FIG. 5, the fourth guide slot 3040 include an open end 3041 and a close end 3042 that are opposite to each other, and a height H1 of the open end 3041 relative to the bearing base bottom plate 3010 is lower than a height H2 of the close end 3042 relative to the bearing base bottom plate 3010, but the invention is not limited thereto. In other embodiments, the height of the open end relative to the bearing base bottom plate may be equal to or higher than the height of the close end relative to the bearing base bottom plate.

However, the second guide pillars 308, the sliders 304, the second pivots 305, the third pivots 306 and the linkages 307 are optional. In other embodiments, the server may not include the second guide pillar 308, and the mounting cage may not include the slider 304, the second pivot 305, the third pivot 306 and the linkage 307. In the embodiments where the server does not include the second guide pillars 308, the bearing base side plates may not include the second guide slots 3013. In the embodiments where the mounting cage does not include the slider 304, the bearing base side plate may not include the third guide slot 3015.

Moreover, the invention is not limited by the quantities of the first guide pillars 500, the engagement holes 3023 of the handle 302 and the first pivots 303. In other embodiments, there may be one first guide pillar, one engagement hole and one first pivot, and the handle only includes one engagement part and one handheld part and does not include the connecting part 3021.

Please refer back to FIG. 1 and FIG. 2, in this embodiment, the expansion card 700 includes an expansion plate 701, a plurality of connectors 702, a plurality of second ports 703 and a plurality of processing units 704. The expansion plate 701 is stacked on the bearing base bottom plate 3010. The connectors 702 are disposed on a side of the expansion plate 701 that is located away from the bearing base bottom plate 3010 and are configured for the insertion of, for example, memory cards (not shown). The second ports 703 are disposed on a side of the expansion plate 701 that is located close to the bearing base bottom plate 3010 and are electrically connected to the connectors 702. In this embodiment, the bearing base bottom plate 3010 include a plurality of through holes 3014 and the second ports 703 respectively penetrate through the through holes 3014 of the bearing base bottom plate 3010 so as to be plugged into the first ports 202. That is, the connectors 702 are electrically connected to the motherboard 200 via the first ports 202 and the second ports 703. The processing units 704 are disposed on a side of the expansion plate 701 that is located away from the bearing base bottom plate 3010 and are, for example, Central Processing Units (CPUs).

In addition, as shown in FIG. 1, longitudinal sides 7020 of the connectors 702 are substantially perpendicular to a pivot axis C of the first pivots 303. Thus, the connectors 702 can help the expansion plate 701 to bear the moment applied on the expansion plate 701 by pivoting the first pivots 303 about the pivot axis C, such that the expansion plate 701 is prevented from being bent or deformed due to a large amount of moment applied thereto. However, in other embodiments, the longitudinal sides of the connectors may have an acute angle at the pivot axis of the first pivots or they may have other non-parallel geometric relationship as long as the connectors is able to help the expansion plate to bear the moment applied to the expansion plate by pivoting the first pivots about the pivot axis.

In addition, in other embodiments, the bearing base bottom plate may not include the through holes 3014 where the second ports penetrate, and the size of the bearing base bottom plate may be adjusted to allow the second ports to be plugged into the first ports.

Furthermore, the support frames 400 are optional. In other embodiments, the server may not include the support frames 400, and the bearing base bottom plate may be spaced apart from the motherboard by being supported by the first guide pillars, the third guide pillars and the first ports of the motherboard.

The operations for the expansion card 700 to be removed from and mounted on the motherboard 200 with the help of the handle 302 of the mounting cage 300 are illustrated below. In this embodiment, the handle 302 includes a folded position and an unfolded position. Please refer to FIGS. 5 to 7, where FIG. 6 is a partially enlarged side cross-sectional view showing that a handle is located in a folded position, and FIG. 7 is a partially enlarged side cross-sectional view showing that the handle is located in an unfolded position.

Figure 6:
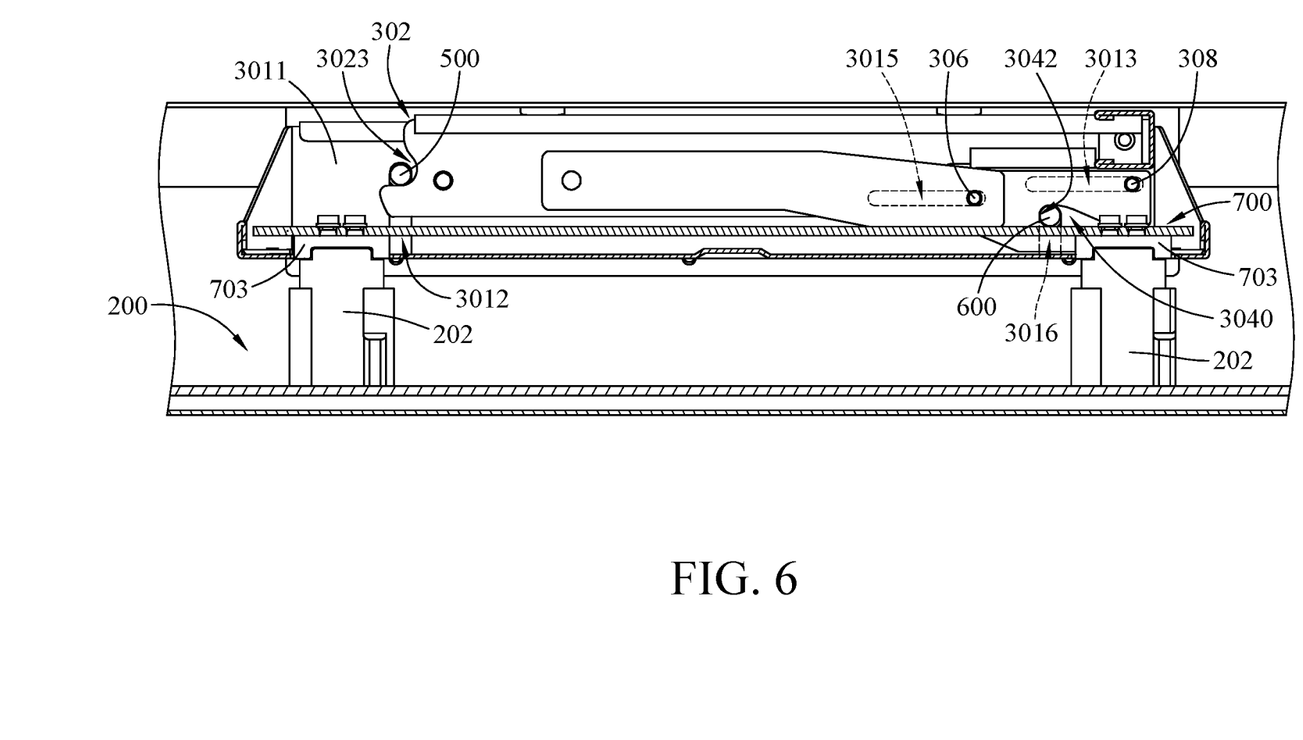
FIG. 6 is a partially enlarged side cross-sectional view showing that a handle is located in a folded position.

As shown in FIG. 6, when the handle 302 is located in the folded position, the second ports 703 of the expansion card 700 are respectively plugged into the first ports 202 of the motherboard 200. In addition, as shown in FIG. 6, the first guide pillar 500 is located at a side of the first guide slot 3012 of the bearing base side plate 3011, the second guide pillar 308 is located at a side of the second guide slot 3013, the third pivot 306 is located at a side of the third guide slot 3015, and the third guide pillar 600 is located at a side of the fifth guide slot 3016 and is located at the close end 3042 of the fourth guide slot 3040.

Figure 7:
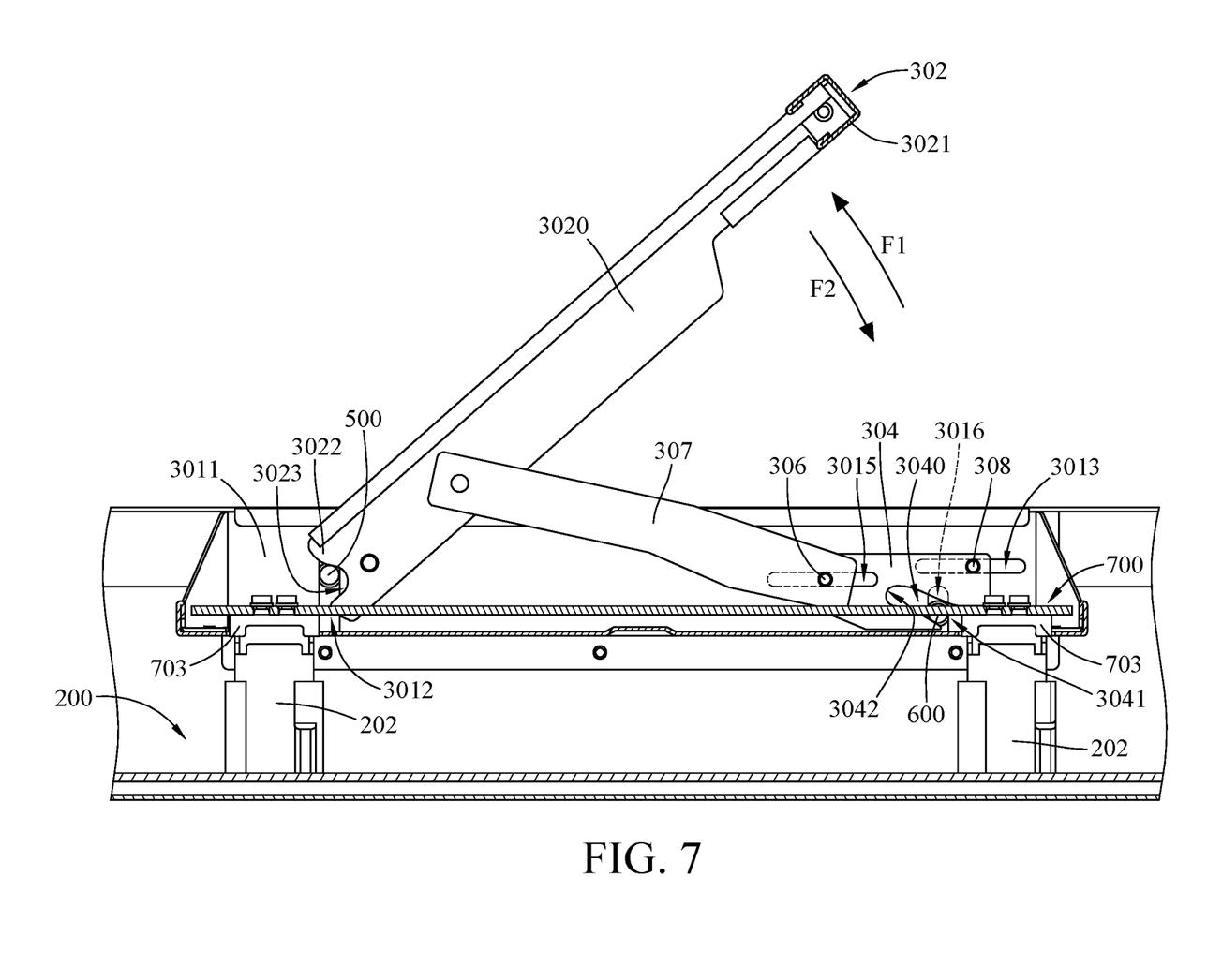
FIG. 7 is a partially enlarged side cross-sectional view showing that the handle is located in an unfolded position.

As shown in FIG. 7, when the connecting part 3021 of the handle 302 is pulled along an unfolding direction F1 to force the handle 302 to be pivoted from the folded position to the unfolded position, the handheld part 3020 and the engagement part 3022 of the handle 302 are pivoted relative to the bearing base side plate 3011 so that the engagement part 3022 pushes the first guide pillar 500 engaged in the engagement hole 3023 toward the other side of the first guide slot 3012. Also, the handheld part 3020 of the handle 302 moves the slider 304 via the linkage 307 so that the second guide pillar 308 moves toward the other side of the second guide slot 3013 and the third pivot 306 moves toward the other side of the third guide slot 3015. In addition, the slider 304 pushes the third guide pillar 600 toward the other side of the fifth guide slot 3016 and pushes the third guide pillar 600 from the close end 3042 of the fourth guide slot 3040 toward the open end 3041 of the fourth guide slot 3040.

Since the engagement part 3022 pushes the first guide pillar 500 toward the other side of the first guide slot 3012 and the slider 304 pushes the third guide pillar 600 toward the other side of the fifth guide slot 3016, the bearing base 301 is moved away from the motherboard 200 to help the second ports 703 of the expansion card 700 to respectively be detached from the first ports 202 of the motherboard 200.

Also, besides the first guide pillar 500, the third guide pillar 600 also help the bearing base 301 to be moved away from the motherboard 200, and the third pivot 306 and the second guide pillar 308 also bear the reaction force generated by pushing the bearing base 301 away from the motherboard 200. That is, the first guide pillar 500, the third guide pillar 600, the third pivot 306 and the second guide pillar 308 share such reaction force generated by pushing the bearing base 301 away from the motherboard 200, such that the first guide pillar 500 need not to bear all of such reaction force.

Moreover, the position of the connecting part 3021 of the handle 302 relative to the expansion card 700 as the handle 302 is located at the unfolded position is designed based on the position of the center of gravity of the expansion card 700.

As shown in FIG. 6 and FIG. 7, when the connecting part 3021 is pulled along a folding direction F2 opposite to the unfolding direction F1 and the mounting cage 300 and the expansion card 700 are pushed toward the motherboard 200, the expansion card 700 is mounted to the motherboard 200, and that is to say that the second ports 703 of the expansion card 700 are respectively plugged into the first ports 202 of the motherboard 200. It is noted that, since the height H1 of the open end 3041 of the fourth guide slot 3040 relative to the bearing base bottom plate 3010 is lower than the height H2 of the close end 3042 of the fourth guide slot 3040 relative to the bearing base bottom plate 3010, when the connecting part 3021 is pulled along the folding direction F2, the third guide pillar 600 that moves from the open end 3041 toward the close end 3042 and moves back to the side of the fifth guide slot 3016 slows down the movement of the handle 302.

According to the server and the mounting cage disclosed by the above embodiments, the handle is pivotally connected to one of the bearing base side plate via the first pivot and includes the engagement hole for the engagement of the first guide pillar, and the first guide pillar is fixed to one of the chassis side plate and slidably disposed in the first guide slot of one of the bearing base side plate. Thus, the handle can help the expansion card to be removed from or mounted to the motherboard via the cooperation of the first guide pillar and the first guide slot, thereby improving the convenience for the expansion card to be removed from or mounted to the motherboard with the help of the handle.

In addition, since the longitudinal sides of the connectors are non-parallel to the pivot axis of the first pivot, when the mounting cage is removed or mounted with the help of the handle, the moment produced by the connectors relative to the center part of the expansion plate is reduced. Also, the connector and the expansion plate can share the reaction force generated by pivoting the handle. In this way, the deformations of the expansion plate and the mounting cage are prevented.

Furthermore, the handle is fixed to the chassis side plate via the first guide pillar, the slider is fixed to the second guide pillar slidably disposed on the bearing base side plate, and the handle and the slider are connected via the linkage. Thus, besides the first guide pillar, the second guide pillar also help the first guide pillar to bear the reaction force generated by pivoting the handle. In this way, the first guide pillar need not bear all of the reaction force so that the bearing base side plate is prevented from being bent or deformed.

In an embodiment, the server disclosed by the invention can be applied to artificial intelligence (AI) computing, edge computing and can be used as 5G server, cloud computing server, or internet of vehicle server.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A mounting cage, configured to be fixed to a chassis side plate via a first guide pillar, the mounting cage comprising:
- a bearing base, comprising a bearing base bottom plate and two bearing base side plates, the two bearing base side plates standing on the bearing base bottom plate and spaced apart from each other, one of the two bearing base side plates comprising a first guide slot and a second guide slot that are spaced apart from each other, the first guide pillar configured to be slidably disposed in the first guide slot;
- a second guide pillar, slidably disposed in the second guide slot;
- a handle, pivotally connected to the one of the two bearing base side plates and comprising an engagement hole, the first guide pillar configured to be engaged in the engagement hole;
- a slider, fixed to the second guide pillar; and
- a linkage, two opposite ends of the linkage respectively pivotally connected to the handle and the slider.

* * * * *